(12) United States Patent
Shatalov et al.

(10) Patent No.: US 12,125,940 B2
(45) Date of Patent: Oct. 22, 2024

(54) SEMICONDUCTOR HETEROSTRUCTURE WITH IMPROVED LIGHT EMISSION

(71) Applicant: Sensor Electronic Technology, Inc., Columbia, SC (US)

(72) Inventors: Maxim S. Shatalov, Mt. Sinai, NY (US); Alexander Dobrinsky, Vienna, VA (US)

(73) Assignee: Sensor Electronic Technology, Inc., Columbia, SC (US)

( * ) Notice: Subject to any disclaimer, the term of this patent is extended or adjusted under 35 U.S.C. 154(b) by 444 days.

(21) Appl. No.: 17/372,992

(22) Filed: Jul. 12, 2021

(65) Prior Publication Data

US 2021/0343899 A1 Nov. 4, 2021

Related U.S. Application Data

(63) Continuation of application No. 16/169,431, filed on Oct. 24, 2018, now Pat. No. 11,063,178.

(Continued)

(51) Int. Cl.
| | |
|---|---|
| H01L 33/06 | (2010.01) |
| H01L 33/00 | (2010.01) |
| H01L 33/04 | (2010.01) |
| H01L 33/10 | (2010.01) |
| H01L 33/12 | (2010.01) |
| H01L 33/32 | (2010.01) |

(Continued)

(52) U.S. Cl.
CPC .......... *H01L 33/06* (2013.01); *H01L 33/0025* (2013.01); *H01L 33/12* (2013.01); *H01L 33/32* (2013.01); *H01L 33/36* (2013.01); *H01L 33/62* (2013.01); *H01L 33/04* (2013.01); *H01L 33/10* (2013.01)

(58) Field of Classification Search
CPC ................................ H01L 33/06; H01L 33/10
See application file for complete search history.

(56) References Cited

U.S. PATENT DOCUMENTS

| 2001/0030318 A1 | 10/2001 | Nakamura et al. |
| 2004/0238839 A1 | 12/2004 | Lai et al. |

(Continued)

FOREIGN PATENT DOCUMENTS

| KR | 20130065096 A | * | 6/2019 |

OTHER PUBLICATIONS

Niesz, Jamie, U.S. Appl. No. 16/169,431, Notice of Allowance, Mar. 17, 2021, 8 pages.

(Continued)

*Primary Examiner* — Alia Sabur
(74) *Attorney, Agent, or Firm* — LaBatt, LLC

(57) ABSTRACT

A semiconductor heterostructure for an optoelectronic device with improved light emission is disclosed. The heterostructure can include a first semiconductor layer having a first index of refraction n1. A second semiconductor layer can be located over the first semiconductor layer. The second semiconductor layer can include a laminate of semiconductor sublayers having an effective index of refraction n2. A third semiconductor layer having a third index of refraction n3 can be located over the second semiconductor layer. The first index of refraction n1 is greater than the second index of refraction n2, which is greater than the third index of refraction n3.

20 Claims, 7 Drawing Sheets

Related U.S. Application Data

(60) Provisional application No. 62/612,506, filed on Dec. 31, 2017, provisional application No. 62/576,700, filed on Oct. 25, 2017.

(51) Int. Cl.
*H01L 33/36* (2010.01)
*H01L 33/62* (2010.01)

(56) References Cited

U.S. PATENT DOCUMENTS

| | | | |
|---|---|---|---|
| 2005/0230695 A1* | 10/2005 | Takayama | H01S 5/34333 257/94 |
| 2006/0285560 A1 | 12/2006 | Nagashima et al. | |
| 2011/0253975 A1* | 10/2011 | Shatalov | B82Y 20/00 438/37 |
| 2011/0272723 A1 | 11/2011 | Ha et al. | |
| 2013/0207075 A1 | 8/2013 | Myers et al. | |
| 2014/0077221 A1 | 3/2014 | Genei et al. | |
| 2014/0346441 A1* | 11/2014 | Shur | H01L 33/18 257/15 |
| 2016/0005919 A1 | 1/2016 | Obata | |
| 2016/0156156 A1 | 6/2016 | Yang | |
| 2018/0019375 A1 | 1/2018 | Fujita et al. | |
| 2019/0006558 A1 | 1/2019 | Watanabe et al. | |

OTHER PUBLICATIONS

Niesz, Jamie, U.S. Appl. No. 16/169,431, Final Office Action 1, Nov. 9, 2020, 8 pages.

Niesz, Jamie, U.S. Appl. No. 16/169,431, Office Action 1, Mar. 27, 2020, 17 pages.

Smith III, Brice Robert, U.S. Appl. No. 17/372,963, Office Action dated Dec. 20, 2023, 21 pages.

Smith III, Brice Robert, U.S. Appl. No. 17/372,963, Final Office Action, May 31, 2024, 29 pages.

Liu, Yao, et al., "Composition and temperature dependent optical properties of Al$_x$Ga1-xN alloy by spectroscopic ellipsometry," Applied Surface Science, Feb. 2, 2017, 8 pages.

Brunner, D., et al., "Optical constants of epitaxial AlGaN films and their temperature dependence," Journal of Applied Physics, Nov. 15, 1997, 8 pages.

Smith III, Brice Robert, U.S. Appl. No. 17/372,963, Advisory Action, Jul. 29, 2024, 4 pages.

Request for Ex Parte Reexamination for U.S. Pat. No. 11,063,178, Jun. 17, 2022, 29 pages.

Order Granting Request for Ex Parte Reexamination for U.S. Pat. No. 11,063,178, Jul. 26, 2022, 18 pages.

Office Action in Ex Parte Reexamination for U.S. Pat. No. 11,063,178, Nov. 25, 2022, 13 pages.

Notice of Intent to Issue Ex Parte Reexamination Certificate for U.S. Pat. No. 11,063,178, Mar. 9, 2023, 5 pages.

1 Office action for U.S. Appl. No. 17/372,963, filed Aug. 28, 2024, 33 pages.

* cited by examiner (a) $B_xAl_{1-x}N$ (b) $B_yGa_{1-y}N$

SEMICONDUCTOR HETEROSTRUCTURE WITH IMPROVED LIGHT EMISSION

REFERENCE TO RELATED APPLICATIONS

The current application is a continuation of U.S. patent application Ser. No. 16/169,431, filed on 24 Oct. 2018, which claims the benefit of U.S. Provisional Application No. 62/576,700, filed on 25 Oct. 2017, and U.S. Provisional Application No. 62/612,506, filed on 31 Dec. 2017, all of which are hereby incorporated by reference.

TECHNICAL FIELD

The disclosure relates generally to electronic and optoelectronic devices, and more particularly, to semiconductor light emitting devices composed of group III nitride alloys.

BACKGROUND ART

Semiconductor light emitting devices, such as light emitting diodes (LEDs) and laser diodes (LDs), generally include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride-based LEDs and LDs can be of the form $In_yAl_xGa_{1-x-y}N$, where x and y indicate the molar fraction of a given element, $0 \le x$, $y \le 1$, and $0 \le x+y \le 1$. Other illustrative group III nitride-based LEDs and LDs are based on boron nitride (BN) and can be of the form $Ga_zIn_yAl_xB_{1-x-y-z}N$, where $0 \le x$, $y$, $z \le 1$, and $0 \le x+y+z \le 1$.

An LED is typically composed of semiconducting layers. During operation of the LED, an applied bias across doped layers leads to injection of electrons and holes into an active region where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the optical properties of the layer. In particular, the refractive index and absorption characteristics of a layer are sensitive to the molar fractions of the semiconductor alloy.

An interface between two layers can be defined as a semiconductor heterojunction. At an interface, the combination of molar fractions is assumed to change by a discrete amount. A layer in which the combination of molar fractions changes continuously is said to be graded. Changes in molar fractions of semiconductor alloys can allow for band gap control, but can lead to abrupt changes in the optical properties of the materials and result in light trapping. A larger change in the index of refraction between the layers, and between the substrate and its surroundings, results in a smaller total internal reflection (TIR) angle (provided that light travels from a high refractive index material to a material with a lower refractive index). A small TIR angle results in a large fraction of light rays reflecting from the interface boundaries, thereby leading to light trapping and subsequent absorption by layers or LED metal contacts.

Roughness at an interface allows for partial alleviation of the light trapping by providing additional surfaces through which light can escape without totally internally reflecting from the interface. Nevertheless, light only can be partially transmitted through the interface, even if it does not undergo TIR, due to Fresnel losses. Fresnel losses are associated with light partially reflected at the interface for all the incident light angles. Optical properties of the materials on each side of the interface determine the magnitude of Fresnel losses, which can be a significant fraction of the transmitted light. In particular, Fresnel losses associated with high total internal reflection limit efficiencies of light emitting diodes.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention are directed to a semiconductor heterostructure with improved light emission. The semiconductor heterostructure of the various embodiments, which can be used to fabricate an optoelectronic device, can include a group III nitride structure. The optoelectronic device that can be fabricated from the semiconductor heterostructure of the various embodiments can include a light emitting device. Examples of light emitting devices that can be fabricated from any semiconductor heterostructure described herein can include, but are not limited to, light emitting diodes (LEDs), ultraviolet LEDs (UV LEDs) and laser diodes (LDs).

In one or more of the various embodiments, light emission is improved by reducing Fresnel reflective losses associated with the total internal reflection (TIR) that occurs at the interfaces between the semiconductor layers that form the semiconductor heterostructure. In particular, the TIR that occurs between semiconductor layers of the semiconductor heterostructure is substantially eliminated by fabricating layers with an index of refraction that is appropriate for removing the TIR. In general, the semiconductor heterostructure can include a first semiconductor layer having a first index of refraction n1, a second semiconductor layer formed over the first semiconductor layer having an index of refraction n2, and a third semiconductor layer formed over the second semiconductor layer having a third index of refraction n3, wherein n1>n2>n3.

In one embodiment, the first semiconductor layer and the third semiconductor layer can take the form of a cladding layer, and the second semiconductor layer can take the form of an active region that is sandwiched between the cladding layers. To this extent, the light generated from the active region can be outputted from the semiconductor heterostructure at the side of the cladding layer having the refractive index n1. In one embodiment, the cladding layer having the refractive index n1 can include an n-type cladding layer and the cladding layer having the refractive index n3 can include an electron blocking layer (e.g., a p-type blocking layer).

The active region can comprise a complex structure, and in general, can comprise a laminate of semiconductor layers (e.g., semiconductor sublayers). In one embodiment, the active region can comprise quantum wells and barriers, with the quantum wells being significantly thinner than barriers. For example, the quantum wells can have a thickness that comprises several nanometers (e.g., a thickness less than 5 nm), while the barriers can be at least twice as thick (e.g., as large as ten or more nanometers). It is understood that the index of refraction of an active region formed from a laminate of semiconductor layers will include an effective index of refraction that accounts for the respective indexes of refraction of the layers of the laminate.

The semiconductor heterostructure can also include a fourth semiconductor layer having an index of refraction n4. In one embodiment, the fourth semiconductor layer can be formed over the third semiconductor layer such that the fourth index of refraction n4 is greater than the third index of refraction n3. To this extent, the relationship of the indexes of refractions of the semiconductor heterostructure that includes the aforementioned first semiconductor layer, the second semiconductor layer, the third semiconductor layer and the fourth semiconductor layer can be described by n1>n2>n3>n4. In one embodiment, the fourth semiconductor layer can include a p-type layer. For example, in the embodiment in which the semiconductor heterostructure includes an active region sandwiched between an n-type cladding layer and an electron blocking layer, the p-type layer can be formed over the electron blocking layer. In one embodiment, the p-type layer can include a superlattice having a plurality of interlayers. For example, the superlattice of interlayers can include a p-type superlattice having a plurality of barriers.

The indexes of refraction (i.e., n1, n2, n3, n4) of the various semiconductor layers in the semiconductor heterostructure and the desired relationship of the indexes (e.g., n1>n2>n3 and n1>n2>n3>n4) in the heterostructure can be obtained by selecting appropriate amounts of group III nitride materials (e.g., AlN, GaN) used in the layers. For example, the active region can have a composition of a group III nitride material that results in the active region having an index of refraction that is smaller than the first cladding layer (e.g., the n-type cladding layer) and greater than the second cladding layer (e.g., the electron blocking layer). In a scenario in which the active region comprises a plurality of quantum wells and a plurality of barriers, the barriers can have a high molar fraction of a group III nitride material with a low refractive index, while the quantum wells can have a low molar fraction of a group III nitride material with a low refractive index. For example, the barriers can have a high molar fraction of AlN, while the quantum wells can have a low molar fraction of AlN. To this extent, the barriers will have low indexes of refraction and the quantum wells will have higher indexes of refraction.

In this manner, the active region will have an effective index of refraction that is less than the index of refraction of the n-type cladding layer. It is understood that the molar fraction of AlN within the barriers and the quantum wells is chosen to result in an effective refractive index of the active region that satisfies the relationship between the layers (i.e., n1>n2). As a result, there will be an absence of TIR at the interface between the active region and the n-type cladding layer. In this example, the electron blocking layer can have a high molar fraction of AlN that results in the index of refraction n3 of this layer being smaller than the index of refraction n2 of the active region. To this extent, the change in refractive index from n2 to n3 results in TIR at the interface between the active region and the electron blocking layer. With regard to the fourth semiconductor layer that can be formed with the semiconductor heterostructure, the p-type layer can have a low molar fraction of AlN.

In order to further improve control of the indexes of refraction of the semiconductor layers in the semiconductor heterostructure, additional semiconductor materials can be added to the semiconductor layers to attain desired indexes of refraction by enhancing electrical and optical properties of the layers. In one embodiment, boron nitride (BN) can be added to any of the semiconductor layers of the semiconductor heterostructure. Adding smaller fraction amounts of BN to a group III nitride-based semiconductor layer in the semiconductor heterostructure will not significantly affect the band gap of the semiconductor layer, but such additions can have notable decreases in the index of refraction of the semiconductor layers. For example, a slight addition of BN to AlN and GaN layers can result in significant decreases in the indexes of refraction of the semiconductor layers.

In one embodiment, BN can be added to an active region having barriers and quantum wells. In particular, a molar fraction of BN can be added to the barriers and/or the quantum wells of the active region, with the amount of the BN that is utilized including a molar fraction that preserves a targeted radiation wavelength specified for the optoelectronic device incorporating the semiconductor heterostructure. In one embodiment, a semiconductor heterostructure that includes a p-type layer with interlayers can include a molar fraction of BN in the interlayers. Similarly, a semiconductor heterostructure that includes a p-type superlattice of barriers can include BN in least one of the barriers. The control and improvement of the indexes of refraction of the semiconductor layers of the semiconductor heterostructure are not limited to the addition of BN, but can include adding molar fractions of other materials and compounds such as boron (B) and indium nitride (InN).

The emission of the semiconductor heterostructure of the various embodiments can also be improved by nano-patterning one or more the semiconductor layers that form the heterostructure. For example, the active region can be nano-patterned. In one embodiment, in the scenario in which the active region includes a laminate of sublayers such as quantum wells alternating with barriers, nano-patterning can be utilized to form sets of nano domains of stacked semiconductor sublayers (e.g., quantum wells alternating with barriers). Each nano domain of stacked semiconductor sublayers can be separated from adjacent nano domains of stacked semiconductor sublayers by a predetermined spacing. A set of nano domains of insulating material can be formed about the nano domains of stacked semiconductor sublayers. For example, each nano domain of insulating material can be formed in one of the spacings separating adjacent nano domains of stacked semiconductor sublayers. In one embodiment, the set of nano domains of insulating material can have an index of refraction that is less than the index of refraction of the stacked semiconductor sublayers.

The emission of the semiconductor heterostructure of the various embodiments can also be improved by utilizing any of a multitude of other modalities. For example, any of the semiconductor layers can be formed with a roughness surface at the interface with adjacent layers. Roughness at an interface allows for partial alleviation of the light trapping by providing additional surfaces through which light can escape without totally internally reflecting from the interface. In one embodiment, an interface between the first semiconductor layer (e.g., the n-type cladding layer) and the second semiconductor layer or active region can include a roughness surface.

Another example of a modality that can be used to improve the emission of the semiconductor heterostructure of the various embodiments includes applying an anti-reflective coating to at least one of the semiconductor layers of the heterostructure. In one embodiment, an anti-reflective coating can be applied at a side of the first semiconductor layer (e.g., the n-type cladding layer) that is opposite to the interface with the active region.

A first aspect of the invention provides a semiconductor heterostructure, comprising: a first semiconductor layer having a first index of refraction n1; a second semiconductor layer formed over the first semiconductor layer, the second semiconductor layer including a laminate of a plurality of semiconductor sublayers having an effective index of refraction n2; and a third semiconductor layer formed over the second semiconductor layer, the third semiconductor layer having a third index of refraction n3, wherein n1>n2>n3.

A second aspect of the invention provides a semiconductor heterostructure, comprising: a first cladding layer having a first index of refraction n1; an active region formed over the first cladding layer, the active region including a plurality of semiconductor sublayers having an effective index of refraction n2; and a second cladding layer formed over the active region, the second cladding layer having a third index of refraction n3, wherein n1>n2>n3.

A third aspect of the invention provides an optoelectronic device, comprising: a semiconductor heterostructure, including: an n-type cladding layer having a first index of refraction n1; an active region formed over the n-type cladding layer, the active region including a plurality of quantum wells alternating with a plurality of barriers, wherein the plurality of quantum wells and the plurality of barriers have an effective index of refraction n2; an electron blocking layer formed over the active region, the electron blocking layer having a third index of refraction n3; and a p-type layer formed over the electron blocking layer, the p-type layer having a fourth index of refraction n4, wherein n1>n2>n3>n4, and wherein the p-type layer includes a molar fraction of boron.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
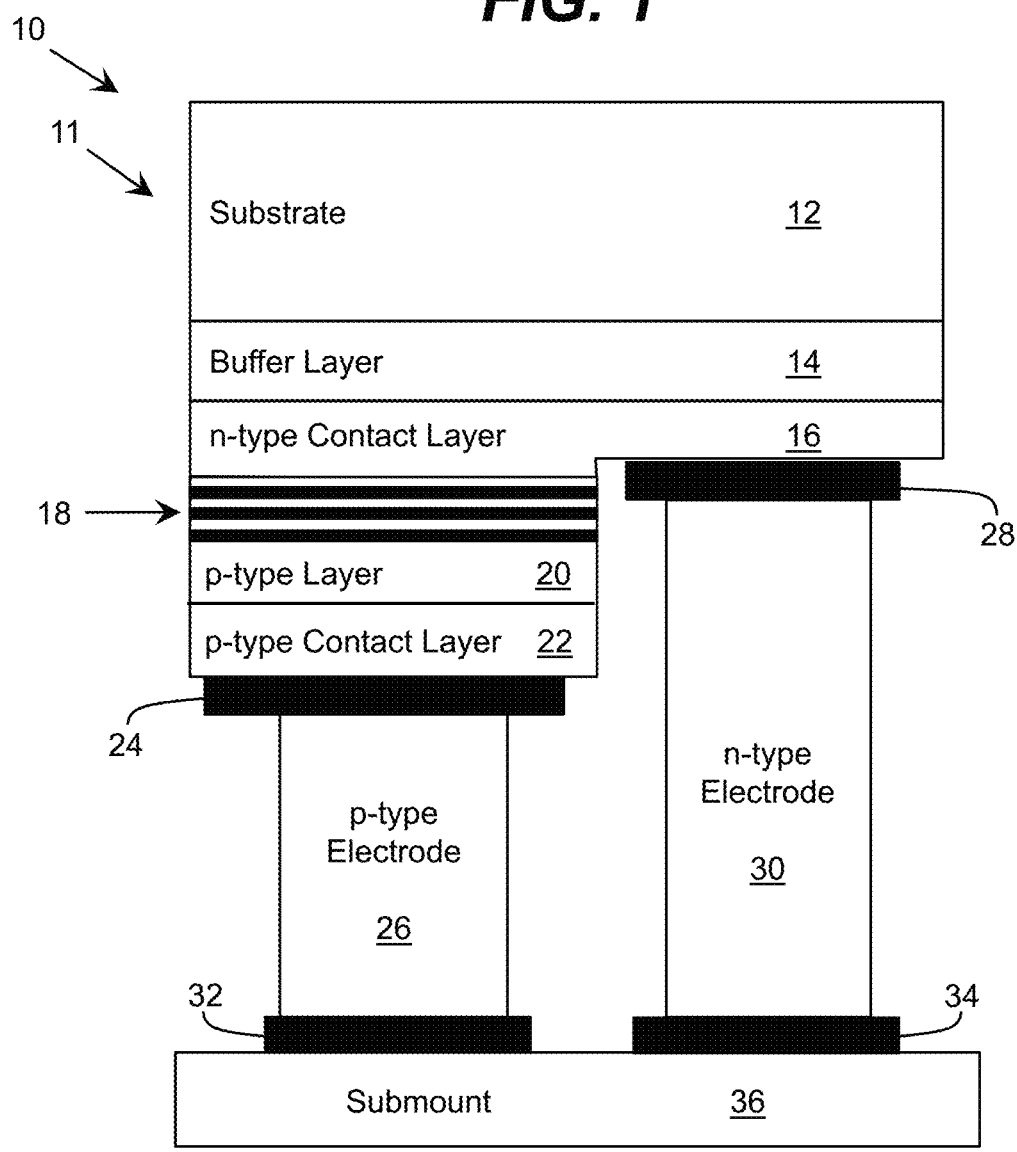
FIG. 1 shows a schematic of an illustrative optoelectronic device having a semiconductor heterostructure according to an embodiment.

As indicated above, aspects of the present invention are directed to a semiconductor heterostructure with improved light emission for use with an optoelectronic device. In at least some of the various embodiments, light emission is improved by reducing Fresnel reflective losses associated with the total internal reflection (TIR) that occurs at the interfaces between the semiconductor layers that form the semiconductor heterostructure. In particular, the TIR that occurs between semiconductor layers of the semiconductor heterostructure is substantially eliminated by fabricating layers with an index of refraction that is appropriate for removing the TIR. In general, the semiconductor heterostructure can include a first semiconductor layer having a first index of refraction n1, a second semiconductor layer formed over the first semiconductor layer having an index of refraction n2, a third semiconductor layer formed over the second semiconductor layer having a third index of refraction n3, wherein n1>n2>n3.

A semiconductor layer of any of the semiconductor heterostructures described herein can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by a light generating structure (e.g., peak emission wavelength+/−five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A semiconductor layer of any semiconductor heterostructures described herein can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The semiconductor heterostructures described herein can be used to form one of a variety of optoelectronic or electronic devices. Examples of possible optoelectronic and electronic devices include, but are not limited to, light emitting devices, light emitting diodes (LEDs), including conventional and super luminescent LEDs, light emitting solid state lasers, laser diodes (LDs), photodetectors, photodiodes, and high-electron mobility transistors (HEMTs), ultraviolet LEDs, and ultraviolet LDs. These examples of optoelectronic devices can be configured to emit or sense electromagnetic radiation in an active region upon application of a bias. The electromagnetic radiation emitted or sensed by these optoelectronic devices can comprise a peak wavelength within any range of wavelengths, including visible light, ultraviolet radiation, deep ultraviolet radiation, infrared light, and/or the like. For example, these optoelectronic devices can emit or sense radiation having a dominant wavelength within the ultraviolet range of wavelengths. As an illustration, the dominant wavelength can be within a range of wavelengths of approximately 210 nanometers (nm) to approximately 350 nm.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof. Additionally, as used herein, "vertical" is used to reference the growth direction of the corresponding structure, while "lateral" is used to reference a direction that is perpendicular to the growth direction. Additionally, spatially relative terms, such as "on," "below," "above," etc., are used in reference to the orientation shown in the drawings. It is understood that embodiments of the invention are not limited to any particular orientation of a device described herein.

The description may also list values of parameters of elements, components, materials, layers, structures, and the like, for the purpose of describing further details of particular embodiments. It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. A value, y, is on the order of a stated value, x, when the value y satisfies the formula $0.1x \leq y \leq 10x$.

As used herein, two materials can have comparable compositions when the molar fractions of the corresponding materials differ by at most ten percent (five percent in a more specific embodiment). For example, consider two group III nitride materials, $Al_xIn_yB_zGa_{1-x-y-z}N$ and $Al_{x'}In_{y'}B_{z'}Ga_{1-x'-y'-z'}N$. The two materials have comparable compositions when each of the molar fractions x, y, and z differs from the corresponding molar fractions x', y', and z' by less than ten percent, where the percentage is calculated by taking a difference between the molar fractions and dividing the value by the higher molar fraction. Similarly, two layers have comparable thicknesses when the corresponding thicknesses differ by at most ten percent (five percent in a more specific embodiment). Unless otherwise specified, two layers have similar thicknesses when the respective thicknesses are within one nanometer (inclusive) of each other. Similarly, two layers have different thicknesses when the thicknesses differ by more than one nanometer. It is understood that two numbers are on the same order as one another when a ratio of the higher number to the lower number is less than ten.

Compositions of two semiconductor layers can also be evaluated in conjunction with the corresponding band gaps. In this case, as used herein, compositions of two semiconductor layers are the same when the band gaps of the two semiconductor layers differ by less than the thermal energy unit, kT. The compositions of two semiconductor layers are substantially the same when the band gaps of the two semiconductor layers differ by less than three times the thermal energy unit, 3 kT. A composition of a first semiconductor layer is considered larger than a composition of a second semiconductor layer when the band gap of the first semiconductor layer is larger than the band gap of the second semiconductor layer by more than the thermal energy unit, kT. A composition of a first semiconductor layer is considered substantially larger than a composition of a second semiconductor layer when the band gap of the first semiconductor layer is larger than the band gap of the second semiconductor layer by more than three times the thermal energy unit, 3 kT. Unless otherwise specified, the thermal energy unit is approximated as 0.026 eV.

Turning to the drawings, FIG. 1 shows a schematic of an optoelectronic device 10 formed from a semiconductor heterostructure 11. In a more particular embodiment, the optoelectronic device 10 is configured to operate as an emitting device, e.g., an LED, such as a deep ultraviolet light emitting diode (DUV LED) or a conventional or super luminescent LED. Alternatively, the optoelectronic device 10 can be configured to operate as a light emitting solid state laser, a laser diode (LD), a photodetector, a photodiode, or another type of optoelectronic or electronic (e.g., a HEMT) device. Additional aspects of the invention are shown and described in conjunction with the optoelectronic device 10. However, it is understood that embodiments can be utilized in conjunction with any type of optoelectronic device and/or any type of group III nitride-based device.

When the optoelectronic device 10 operates as an emitting device, application of a bias comparable to the band gap results in the emission of electromagnetic radiation from an active region 18 of the device 10. The electromagnetic radiation emitted by the optoelectronic device 10 can comprise a peak wavelength within any range of wavelengths, including visible light, ultraviolet radiation, DUV radiation, infrared light, and/or the like. In an embodiment, the optoelectronic device 10 is configured to emit radiation having a dominant wavelength within the ultraviolet range of wavelengths. In a more specific embodiment, the dominant wavelength is within a range of wavelengths between approximately 210 nanometers and approximately 350 nanometers.

The semiconductor heterostructure 11 of the optoelectronic device 10 can include a substrate 12, a buffer layer 14 (e.g., AlN, an AlGaN/AlN superlattice, and/or the like) adjacent to the substrate 12, an n-type contact semiconductor layer 16 (e.g., an electron supply layer, a cladding layer and the like) adjacent to the buffer layer 14, and the active region 18 adjacent to the n-type contact semiconductor layer 16. Furthermore, the heterostructure 11 of the optoelectronic device 10 can include a p-type semiconductor layer 20 (e.g., a cladding layer, an electron blocking layer) adjacent to the active region 18 and a p-type contact semiconductor layer 22

(e.g., a hole supply layer, cladding layer, and the like), adjacent to the p-type semiconductor layer 20.

In a more particular illustrative embodiment, the optoelectronic device 10 can be a group III-V materials-based device in which some or all of the various layers of the semiconductor heterostructure 11 are formed of elements selected from the group III-V materials system. In a still more particular illustrative embodiment, the various layers of the semiconductor heterostructure 11 of the optoelectronic device 10 can be formed of group III nitride-based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials can include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride-based optoelectronic device 10 can include an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type contact layer 16 and the p-type semiconductor layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can include sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like. While further details of various layers are primarily described in conjunction with AlGaN materials, it is understood that this material is only illustrative of various materials. To this extent, it is understood that embodiments of such layers also can comprise group III nitride materials including boron and/or indium. Additionally, other embodiments can include materials other than group III nitride materials, such as other group III-V materials.

As shown with respect to the optoelectronic device 10, a p-type metal contact 24 can be attached to the p-type contact semiconductor layer 22 and a p-type electrode 26 can be attached to the p-type metal contact 24. Similarly, an n-type metal contact 28 can be attached to the n-type contact layer 16 and an n-type electrode 30 can be attached to the n-type metal contact 28. The p-type metal contact 24 and the n-type metal contact 28 can form p-type and n-type ohmic contacts, respectively, to the corresponding layers 22, 16, respectively. It is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact.

In an embodiment, the p-type metal contact 24 and/or the n-type metal contact 28 can comprise several conductive and reflective metal layers, while the n-type electrode 30 and/or the p-type electrode 26 can comprise highly conductive metal. In an embodiment, the p-type contact semiconductor layer 22 and/or the p-type electrode 26 can be transparent (e.g., semi-transparent or transparent) to the electromagnetic radiation generated by the active region 18. For example, the p-type contact semiconductor layer 22 and/or the p-type electrode 26 can comprise a short period superlattice lattice structure, such as a transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type contact layer 16 and/or the n-type electrode 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the electrodes 26, 30 in a flip chip configuration. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

Any of the various layers of the device 10 can comprise a substantially uniform composition or a graded composition. For example, a layer can comprise a graded composition at a heterointerface with another layer. In an embodiment, the p-type semiconductor layer 20 comprises a p-type electron blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the semiconductor heterostructure 11 of the optoelectronic device 10 described herein is only illustrative. To this extent, the semiconductor heterostructure 11 can include an alternative layer configuration, one or more additional layers, and/or the like. As a result, while the various layers are shown immediately adjacent to one another (e.g., contacting one another), it is understood that one or more intermediate layers can be present in the semiconductor heterostructure 11. For example, an illustrative semiconductor heterostructure 11 can include an undoped layer between the active region 18 and one or both of the p-type contact semiconductor layer 22 and the n-type contact semiconductor layer 16 (e.g., an electron supply layer).

Furthermore, the semiconductor heterostructure 11 can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type contact semiconductor layer 22 and the active region 18. Similarly, the semiconductor heterostructure 11 can include a p-type layer 20 located between the p-type contact semiconductor layer 22 and the active region 18. The DBR structure and/or the p-type layer 20 can comprise any composition based on a desired wavelength of the light generated by the device/heterostructure. In one embodiment, the DBR structure comprises a Mg, Mn, Be, or Mg+Si-doped p-type composition. The p-type layer 20 can comprise a p-type AlGaN, AlInGaN, and/or the like. It is understood that the semiconductor heterostructure 11 can include both the DBR structure and the p-type layer 20 (which can be located between the DBR structure and the p-type contact layer 22) or can include only one of the DBR structure or the p-type layer 20. In an embodiment, the p-type layer 20 can be included in the device/heterostructure in place of an electron blocking layer. In another embodiment, the p-type layer 20 can be included between the second p-type contact layer 22 and the electron blocking layer.

Figure 2:
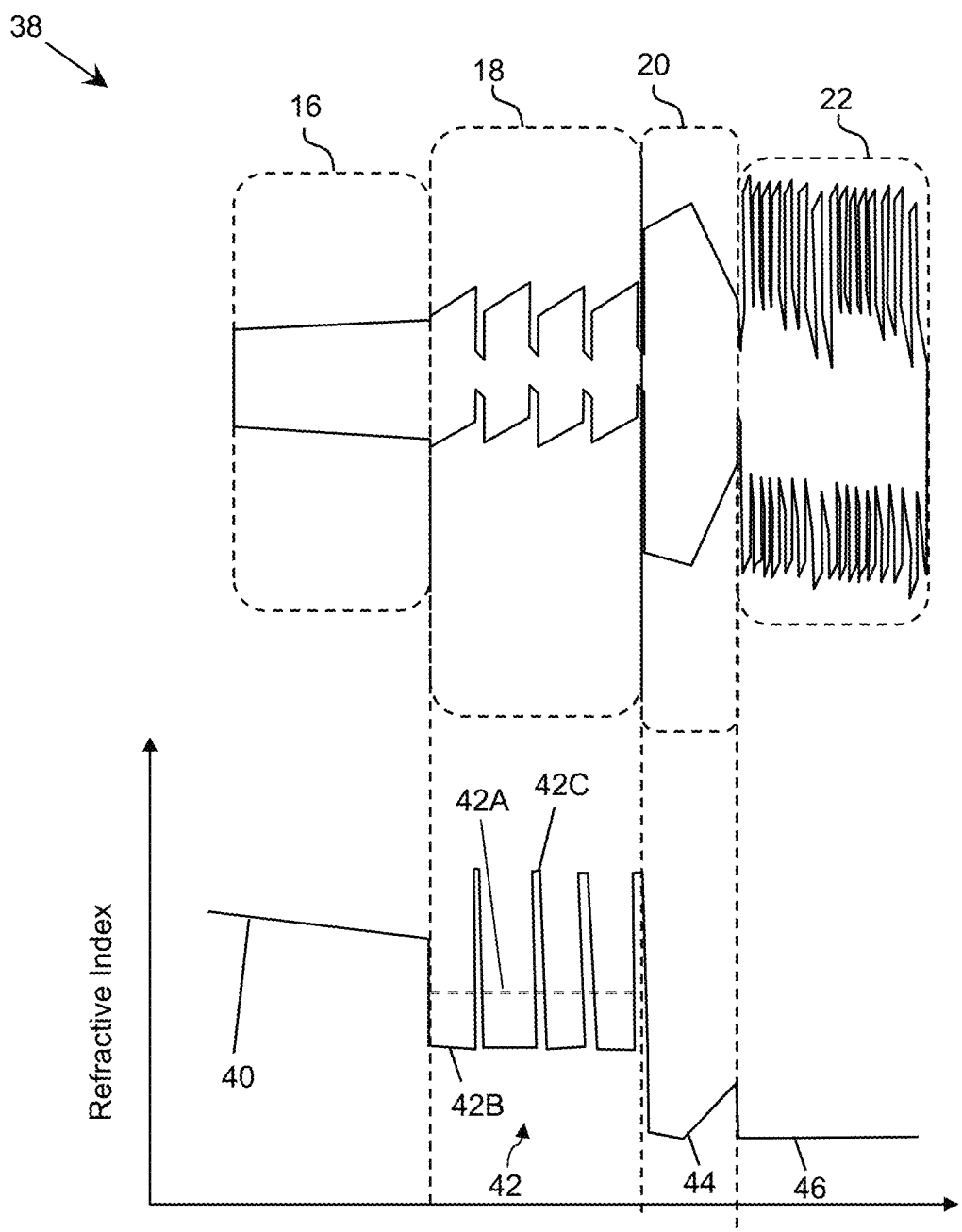
FIG. 2 shows a band diagram and an example of a profile of the refractive index for each layer within an illustrative semiconductor heterostructure according to an embodiment.

FIG. 2 shows a band diagram of an illustrative semiconductor heterostructure 38 for an optoelectronic device, such as the optoelectronic device 10 shown in FIG. 1, and a corresponding example of a profile of the refractive index for each region within the semiconductor heterostructure. For purposes of clarity in maintaining correspondence with the semiconductor heterostructure 11 of the optoelectronic device 10 depicted in FIG. 1, like elements in the semiconductor heterostructure 38 of FIG. 2, as well as the heterostructures of other embodiments, are described with like or corresponding reference numerals. As illustrated, the semiconductor heterostructure 38 includes the active region 18 sandwiched between the n-type contact layer 16 and the p-type layer 20, with the p-type contact layer 22 immediately adjacent the p-type layer 20. In one embodiment, the n-type contact layer 16 and the p-type layer 20 can include cladding layers, and the active region 18 can include a laminate of a plurality of semiconductor layers (e.g., sublayers).

The n-type contact layer 16 can have an index of refraction n1, the active region 18 including a laminate of a plurality of semiconductor layers can have an effective index of refraction n2, while the p-type layer 20 can have a third index of refraction n3. As used herein, an index of refraction for a layer comprises an average index of refraction taken over the entire layer. As also used herein, an effective index of refraction is the realizable index of refraction for a layer or region having a multiple of sublayers, interlayers, or the like, that is obtained by taking into account each of the respective indexes of refraction of all of the sublayers or interlayers that form the layer or region. As an example, an ellipsometer can be used to measure experimentally the indexes of refraction of all of the sublayers or interlayers in a layer or region in order to derive an effective index of refraction.

In one embodiment, the relationship between the indexes of refraction of the n-type contact layer 16, the active region 18 and the p-type layer 20 can be described by n1>n2>n3. Having indexes of refractions such that the index of refraction n1 of the n-type contact layer 16 is greater than the index of refraction n2 of the active region 18 which is greater than the index of refraction n3 of the p-type layer 20 eliminates the TIR that can occur between these semiconductor layers. Light emitting diodes can be fabricated with a quantum efficiency of 70-80% and higher. However, light extraction remains at only a few percent. For light emitting diodes that emit ultraviolet C radiation, TIR is responsible for approximately 90% of the losses. As a result, the improvement of light extraction can result in a dramatic improvement of the light emitting diode performance.

In one embodiment, the laminate of the plurality of semiconductor sublayers within the active region 18 can comprise a plurality of quantum wells and a plurality of barriers, wherein the plurality of quantum wells alternate or interleave with the plurality of barriers. In one embodiment, the quantum wells can be significantly thinner than the barriers. For example, the quantum wells can have a thickness that comprises several nanometers (e.g., a thickness less than 5 nm), while the barriers can be at least twice as thick (e.g., at least 10 nm or more). It is understood that the active region 18 can comprise a non-complex structure (e.g., a region that does not include a laminate of semiconductor layers such as quantum wells and barriers). In this scenario, then it should be appreciated that such an active region will include an index of refraction and not an effective index of refraction.

The p-type contact layer 22 formed adjacent the p-type layer 20 can also include an index of refraction n4. In one embodiment, the index of refraction n4 of the p-type contact layer 22 is less than the index of refraction n3 of the p-type layer 20, such that n3>n4. To this extent, the relationship between the indexes of refraction of the layers in the semiconductor heterostructure 38 of FIG. 2 (e.g., the n-type contact layer 16, the active region 18, the p-type layer 20, and the p-type contact layer 22) can be described by n1>n2>n3>n4.

In one embodiment, the n-type contact layer 16 can include a cladding layer (e.g., an n-type cladding layer) formed adjacent the active region 18 having a laminate of sublayers that can include quantum wells and barriers, while the p-type layer 20 can include another cladding layer (e.g., a p-type cladding layer) formed adjacent the opposing side of the active region 18. In another embodiment, the p-type layer 20 can take the form of an electron blocking layer, while the p-type contact layer 22 can function as the cladding layer (e.g., a p-type cladding layer). As shown in FIG. 2, the p-type contact layer 22 can include a plurality of interlayers. In one embodiment, the p-type contact layer 22 can include a superlattice of interlayers. For example, the superlattice can include a p-type superlattice having a plurality of barriers and quantum barriers.

The indexes of refraction (e.g., n1, n2, n3, n4) of the various semiconductor layers in the semiconductor heterostructure 38, and the desired relationship of the indexes (e.g., n1>n2>n3 and n1>n2>n3>n4) in the heterostructure can be obtained by selecting appropriate amounts of the group III nitride materials (e.g., AlN, GaN, InN, or BN) used in the group III nitride layers. For example, the index of refraction of AlN, n(AlN), is less than the index of refraction of GaN, n(GaN), which is less than the index of refraction of InN, n(InN). As a result, to decrease the refractive index of a group III nitride material, a molar fraction of AlN can be increased and/or a molar fraction of InN can be decreased. In an embodiment, the active region 18 can have a composition that results in the active region having an index of refraction that is smaller than the n-type cladding layer 16 and greater than electron blocking layer (e.g., the p-type layer 20). The barriers of the active region 18 can comprise a group III nitride material having a low index of refraction, while the quantum wells can comprise a group III nitride material having a high index of refraction.

In one example, the barriers can have a high molar fraction of AlN, while the quantum wells can have a low molar fraction of AlN. To this extent, the barriers will have low indexes of refraction and the quantum wells will have high indexes of refraction. In this manner, the active region 18 can be configured to have an effective index of refraction that is lower than the index of refraction of the n-type cladding layer 16. In one embodiment, the barrier layers within the active region 18 can be chosen to have a high molar fraction of AlN to result in an effective index of refraction that is smaller than the index of refraction of the n-type cladding layer 16 that is in proximity to the active region 18. As used herein, "in proximity" means a region that is at least 20 nm within the distance to the interface between the n-type cladding layer 16 and the active region 18.

It is understood that the molar fraction of AlN within the barriers and the quantum wells can be chosen to result in the active region 18 having an effective refractive index that satisfies the relationship between the active region and the n-type cladding layer (e.g., n1>n2). As a result, there will be an absence of TIR at the interface between the active region 18 and the n-type cladding layer 16. In this example, the electron blocking layer (e.g., the p-type layer 20) can have a high molar fraction of AlN that results in the index of refraction n3 of this layer being smaller than the index of refraction n2 of the active region 18. To this extent, the change in refractive index from n2 to n3 results in TIR at the interface between the active region 18 and the electron blocking layer (e.g., the p-type layer 20). With regard to the p-type contact layer 22 that can be formed adjacent the electron blocking layer (e.g., the p-type layer 20), it can have a low molar fraction of AlN.

An example of a profile of the refractive index for each layer within the semiconductor heterostructure 38 is depicted in FIG. 2. As illustrated, region 40 in the profile that corresponds with the n-type contact layer 16, shows that the index of refraction n1 for this layer can vary through its thickness. However, in general, and at least in proximity to the interface with the active region 18, the index of refraction n1 of the n-type contact layer 16 is larger than the averaged refractive index (e.g., the effective refractive index) of the active layer 18 which is depicted in region 42 of the profile in FIG. 2 by reference element 42A. In one embodiment, the refractive index profile of the n-type contact layer 16 can be obtained with a layer that includes a molar fraction of InN.

As also shown, region 42 of the refractive index profile further delineates details of the refractive indexes associated with the barriers and the wells of the active region 18. In this case, the index of refraction of the barriers are represented by reference element 42B, while the quantum wells are represented by reference element 42C. In one embodiment, the barriers can have low indexes of refraction and the quantum wells can have high indexes of refraction. As used herein, a low index of refraction means an index of refraction below the index of refraction of the region 40, while a high index of refraction means an index of refraction above the index of refraction of the region 40. In one embodiment, as noted above, quantum wells with a low molar fraction of AlN, and barriers with a high molar fraction of AlN can result in the active region 18 having an index of refraction that is less than the index of refraction of the n-type contact layer 16. To this extent, having such molar fractions of AlN in the barriers and the quantum wells can lead to the active region 18 having an effective index of refraction (e.g., index of refraction 42A) that is less than the index of refraction of the n-type contact layer 16. As a result, the interface between the n-type contact layer 16 and the active region 18 will have an absence of TIR.

Region 44 of the profile of the refractive index of the semiconductor heterostructure 38 in FIG. 2 corresponds with the index of refraction of the p-type layer 20. In one embodiment, the p-type layer 20 can include a high molar fraction of a group III nitride material with a low refractive index. For example, the p-type layer 20 can include a high molar fraction of AlN. In this manner, as shown in FIG. 2, the p-type layer 20 can have an index of refraction that is less than the effective index of refraction 42A of the active region 18. As a result, the interface between the active region 18 and the p-type layer 20 can have TIR.

In FIG. 2, region 46 of the profile of the refractive index represents the effective index of refraction of the p-type contact layer 22 in the semiconductor heterostructure 38. As noted above, the p-type contact layer 22 can include a p-type superlattice with interlayers or a p-type layer. In either case, a certain composition of group III nitride materials can be used to obtain a desired index of refraction for the p-type contact layer 22. In one embodiment, the p-type contact layer 22 can have a low molar fraction of AlN or GaN. A low molar fraction of GaN and a high molar fraction of AlN in the p-type contact layer 22 can result in this layer having an index of refraction that is less than the effective index of refraction of the active region 18 and of the p-type layer 20 as shown in FIG. 2.

Figure 3:
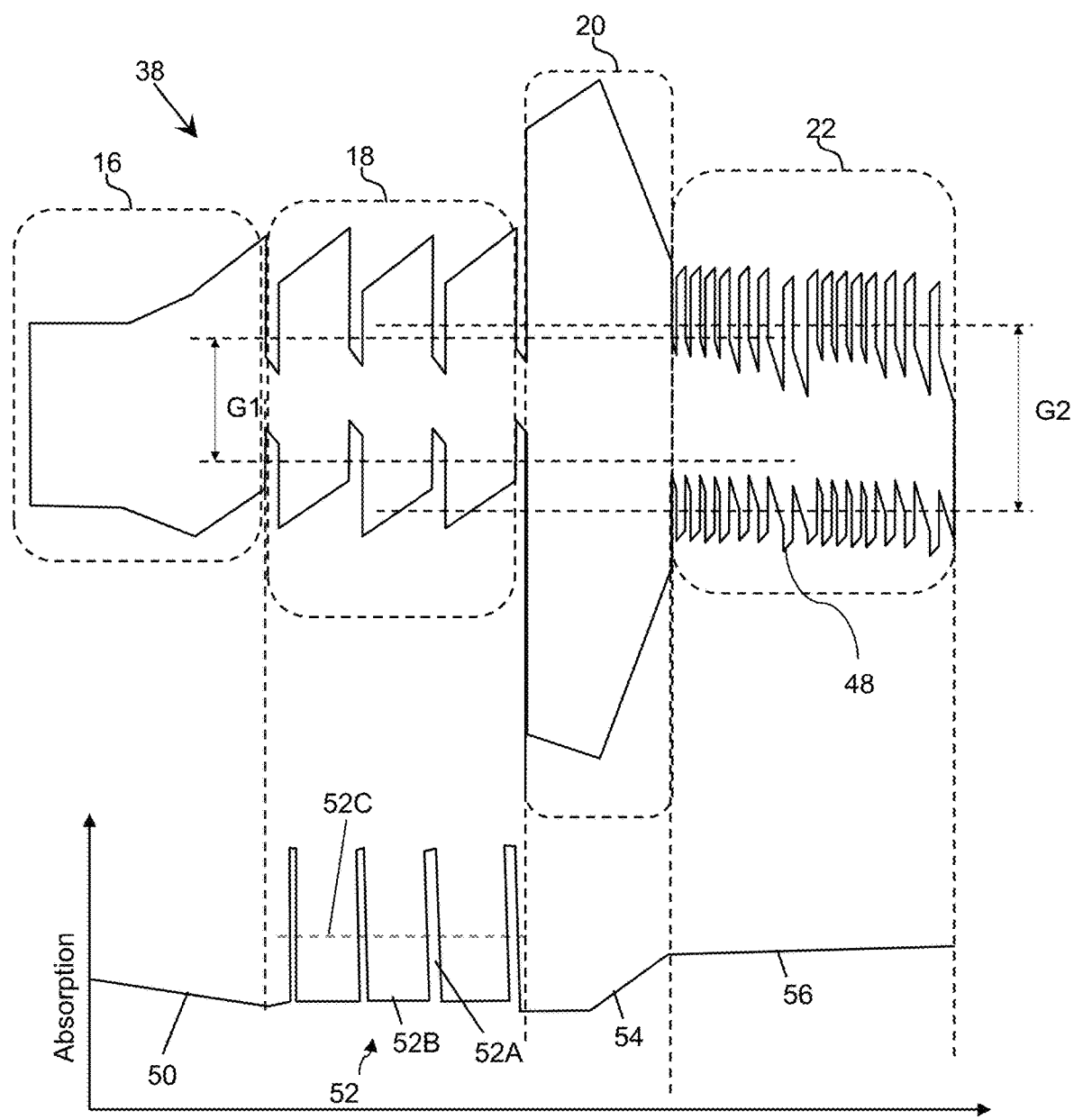
FIG. 3 shows another view of the band diagram and an example of a profile of the absorption values of the semiconductor layers of an illustrative semiconductor heterostructure according to an embodiment.

In order for the semiconductor heterostructure 38 to provide improved light emission, it is preferable that most of the semiconductor layers (e.g., the n-type contact layer 16, the active region 18, the p-type layer 20, and the p-type contact layer 22) in the heterostructure be partially transparent to the emitting or sensing radiation. FIG. 3 shows an illustrative view of a band diagram of another semiconductor heterostructure 38 along with an example of a profile of the absorption values of the semiconductor layers within the semiconductor heterostructure 38. The band diagram of FIG. 3 shows that the semiconductor heterostructure 38 can operate at a wavelength of emission (photon energy) corresponding to the energy separation G1 of the energy levels within the sublayers (e.g., the quantum wells and barriers) of the active region 18. The average band gap G2 of the p-type contact layer 22, which as mentioned previously can include a superlattice, can be selected to be greater than G1 to ensure that the superlattice is sufficiently transparent to the emitted (absorbed) target wavelength of the energy G1 from the active region 18.

In one embodiment, in which the p-type contact layer 22 is a superlattice having quantum wells alternating with barriers, the energy G2 can correspond to the minimum value of average band gaps computed over each period of the superlattice, wherein each period includes one barrier and one quantum well. The thicknesses of either the quantum wells or the barriers, or both, of the p-type contact layer 22 can vary as demonstrated by reference element 48 which happens to show the variable thicknesses of the quantum wells. The thicknesses of the quantum wells and/or barriers within the p-type superlattice 22 can range from a few angstroms to a few nanometers, and, in some cases, can be on the order of 10 nanometers.

FIG. 3 further shows that the average band gap of the n-type contact layer 16 (e.g., an n-type cladding layer) can also be larger than G1. As a result, the n-type contact layer 16 can have significant transparency. As used herein, significant transparency means at least 50% transparency to the target wavelength emitted normal to the interface of the layer.

In an embodiment of FIG. 3, the relationship between the indexes of refraction of the layers in the semiconductor heterostructure 38 (e.g., the n-type contact layer 16, the active region 18, the p-type layer 20, and the p-type contact layer 22) can be described by n1>n2>n3<n4. Such a configuration can represent a compromise between a low index of refraction for the p-type contact layer 22 and a high conductivity of the p-type contact layer 22. Since an increase in the AlN molar fraction results in lower conductivity, it may not be desirable to include a sufficient amount of AlN to make n4<n3. To this extent, in FIG. 3 the refractive index of the p-type contact layer 22 may not be low enough such that n4>n3, but the p-type contact layer 22 can be transparent for emitted light. Inclusion of a reflecting metal p-type contact adjacent to the p-type contact layer 22, can allow light to be reflected back through the p-type contact layer 22 and extracted from the n-type (e.g., sapphire) side of the LED with minimum absorption within the p-type contact layer 22.

The band gap diagram of FIG. 3 further illustrates several different characteristics that the various layers of the semiconductor heterostructure 38 can have that contribute to it having improved emission. For example, FIG. 3 shows that the band gap of both the p-type layer 20 and the barriers within the superlattice of the p-type contact 22 can be wider than the band gap of the quantum wells within the active region 18. In an embodiment, the average band gap over the p-type superlattice 22 can be wider than the band gap of the quantum wells within the active region 18. In an embodiment, the average band gap over the p-type superlattice 22 can be wider than the photon energy corresponding to the target radiation.

The band gap of the semiconductor heterostructure 38 can be distinguished with still more characteristics. For example, the p-type contact layer 22 (e.g., the p-type superlattice layer) can have an effective band gap that is higher than the band gap of a sublayer within the laminate of sublayers (e.g., quantum wells) of the active region 18 having the lowest band gap of the sublayers. In one embodiment, at least one sublayer of the laminate of sublayers (e.g., quantum wells) of the active region 18 can have a band gap that is less than the band gap of the n-type contact layer 16, the other sublayers of the active region 18, and the p-type layer 20.

In one embodiment, sublayers in the laminate of sublayers (e.g., barriers) of the active region 18 can have a wider band gap than the band gap of the n-type contact layer 16 at a location that is in the immediate vicinity of an interface between the n-type contact layer 16 and the active region. As used herein, in the immediate vicinity of the interface means a distance being at most 20 nm. FIG. 3 also shows that the p-type layer 20 can comprise a variable band gap. FIG. 3 furthers shows that the p-type layer 20 can have a maximum band gap that is larger than the band gap of any sublayer within the laminate of sublayers (e.g., barriers and quantum wells) of the active region 18. In addition, FIG. 3 shows that any sublayer within the laminate of sublayers (e.g., barriers and quantum wells) of the active region 18 can comprise a band gap that is lower than a minimum band gap of the n-type contact layer 16.

As mentioned above, most of the semiconductor layers (e.g., the n-type contact layer 16, the active region 18, the p-type layer 20 and the p-type contact layer 22) of the semiconductor heterostructure 38 can be partially transparent to the emitting or sensing radiation for purposes of improving light emission. FIG. 3 illustrates an example of a profile of the absorption values for the semiconductor layers within the semiconductor heterostructure 38. The absorption of the layers to a target radiation is represented in FIG. 3 in arbitrary units. As shown in FIG. 3, region 50, which represents the absorption of the target radiation within the n-type contact layer 16, has a substantially uniform, low absorption of the radiation. As used herein, low absorption refers to sub-bandgap absorption (10-1000 cm$^{-1}$).

The most absorption that occurs in the semiconductor heterostructure is in the active region 18 which is depicted in region 52 of the absorption profile. In particular, the quantum wells of the active region, which are shown as region 52A, have the most absorption, while the barriers have the lowest absorption as depicted by region 52B. The mix of levels of absorption that occurs in the quantum wells and the barriers results in the active region having an average or effective absorption shown by 52C. In one embodiment, the average absorption of the active region 18 can be selected to be similar to the absorption of the n-type contact layer 16 (e.g., the n-type cladding layer) and the p-type layer 20 (e.g., the p-type electron blocking layer) which is represented in the absorption profile of FIG. 3 by region 54. As used herein, similar absorption means at least 50% transparency for the wavelength of the target radiation. FIG. 3 also shows that the p-type contact layer 22 can have a substantially uniform, low absorption of the target radiation as shown by region 56. FIG. 3 also shows that an absorption of the n-contact layer 16 and the p-type layer 20 can be higher than the absorption of the sublayer (e.g., quantum well) within the active region having a lowest band gap.

In order to further improve control of the indexes of refraction of the semiconductor layers (e.g., the n-type contact layer 16, the active region 18, the p-type layer 20 and the p-type contact layer 22) in the semiconductor heterostructure 38, additional semiconductor materials can be added to the semiconductor layers to attain desired indexes of refraction by enhancing electrical and optical properties of the layers. In one embodiment, boron nitride (BN) can be added to any of the semiconductor layers of the semiconductor heterostructure 38. Adding smaller fraction amounts of BN to a group III nitride-based semiconductor layer in the semiconductor heterostructure will not significantly affect the band gap of the semiconductor layer, but such additions can have notable decreases in the index of refraction of the semiconductor layers. For example, a slight addition of BN to AlN and GaN layers can result in significant decreases in the indexes of refraction of the semiconductor layers.

Figure 4A:
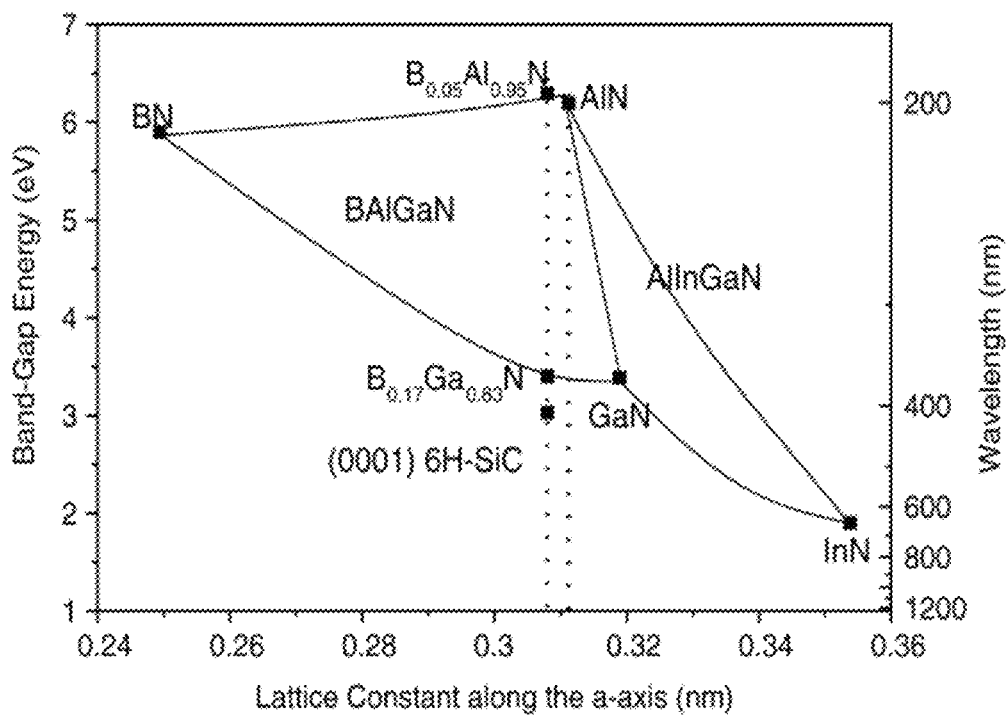
FIGS. 4A and 4B show examples of available band gap energy data for ternary and quaternary semiconductor compounds that can be used in forming any of the semiconductor layers in a semiconductor heterostructure according to an embodiment.
Figure 4B:
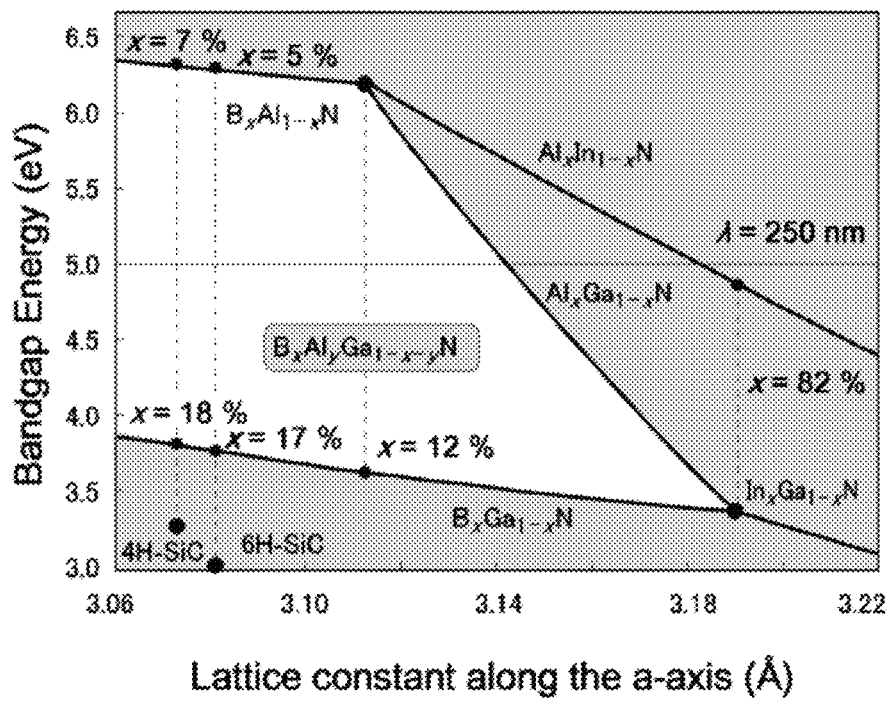

By way of illustration, FIG. 4A shows that a small fraction of BN does not significantly affect the band gap of a semiconductor heterostructure. In particular, FIG. 4A shows that the addition of BN at the expense of an AlN molar fraction does not significantly affect the band gap of a semiconductor layer in a semiconductor heterostructure. FIG. 4A further shows that even an addition of 17% of BN does not significantly alter the band gap of the material. Interestingly, data from FIGS. 4A and 4B also show that a small addition of BN to AlN can increase the band gap of the material.

Figure 5A:
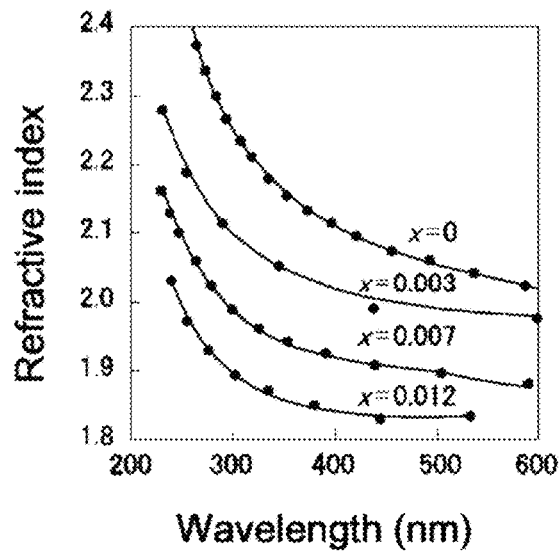
FIGS. 5A and 5B show examples of available refractive index data for ternary semiconductor compounds that can be used in forming any of the semiconductor layers in a semiconductor heterostructure according to an embodiment.
Figure 5B:
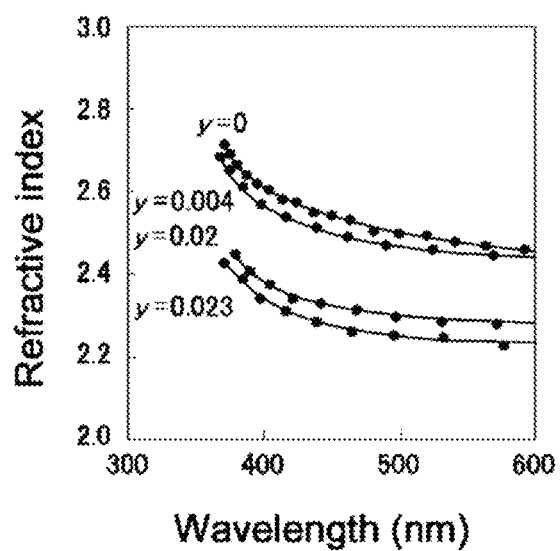

While the addition of BN does not significantly affect band gap characteristics of semiconductor layers, FIGS. 5A and 5B show that even a slight addition of BN to both AlN and GaN results in significant decreases in the index of refraction of the semiconductor layers. In particular, an addition of BN to an active region and an electron blocking layer can create a significant change in the refractive index of the layers. In one embodiment, BN can be added to the active region 18 of the semiconductor heterostructure 38. For example, in the case in which the active region 18 includes barriers and quantum wells, a molar fraction of BN can be added to at least one of: the barriers or the quantum wells, of the active region. In one embodiment, a molar fraction of BN can be added to all of the barriers and the quantum wells of the active region 18. In general, the amount of BN that is utilized can include a molar fraction that preserves the targeted radiation specified for the optoelectronic device incorporating the semiconductor heterostructure 38. Namely, the molar fraction of BN that is selected can preserve the target photon energy G1, which can be further helped by slightly adjusting the thickness of the quantum well layers.

The molar fraction of BN can be added to other layers of the semiconductor heterostructure 38 and is not meant to be limited to use with the active region 18. For example, a molar fraction of BN can be added to the p-type layer 20 and/or the p-type contact layer 22. In one embodiment, a molar fraction of BN can be added to the p-type layer 20 that functions as an electron blocking layer or as a cladding layer. Similarly, the molar fraction of BN can be added to the p-type contact layer 22 that functions as a cladding layer. For example, in the scenario in which the p-type contact layer 22 includes a p-type layer of interlayers, a molar fraction of BN can be added to the interlayers. In an embodiment in which the p-type contact layer 22 includes a p-type superlattice of barriers and quantum wells, a molar fraction of BN can be added to least one of the barriers and/or the quantum wells.

It is understood that the BN molar fraction can be added in various ways. In one embodiment, the BN can be added as interlayers comprising a single atomic plane or a few atomic planes. In an embodiment, the BN molar fraction can be varied with the thickness of the layer to which it is added.

Figure 6:
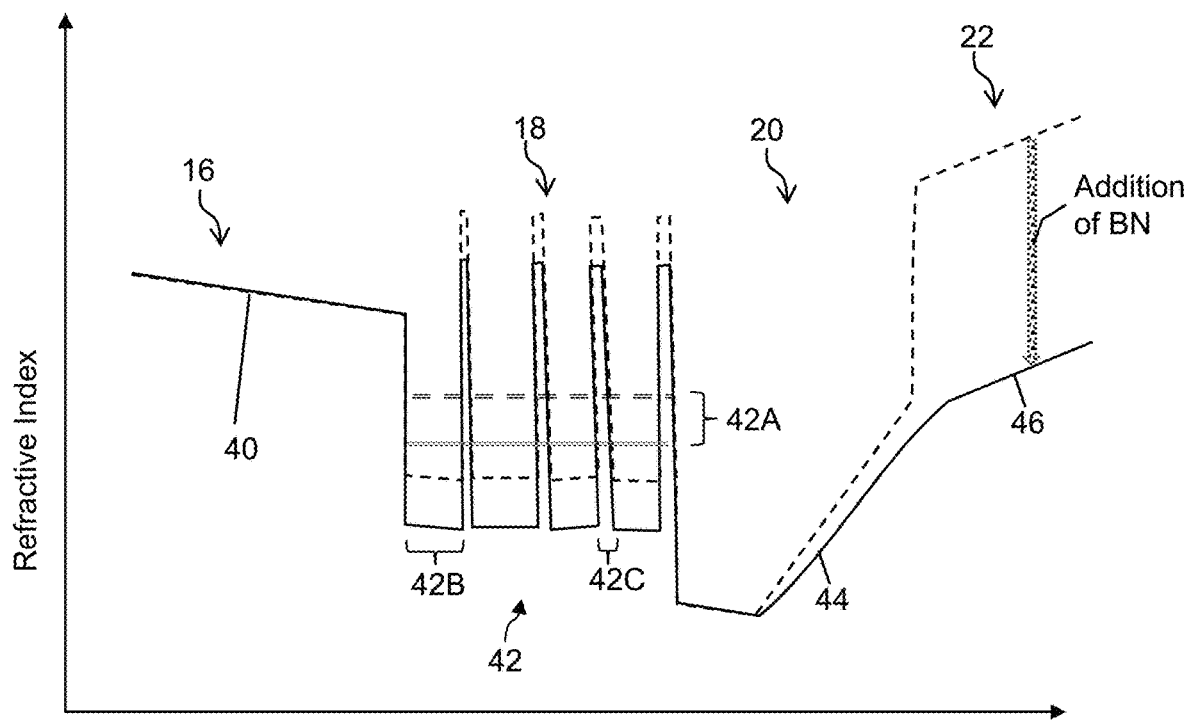
FIG. 6 illustrates an example of an effect that the addition of boron nitride (BN) has on the profile of the index of refraction of semiconductor layers within a semiconductor heterostructure according to an embodiment.

FIG. 6 illustrates an example of an effect that the addition of BN can have on the index of refraction profile of the semiconductor layers within the semiconductor heterostructure 38. In particular, FIG. 6 shows the effect that the addition of BN can have on the index of refraction profile of the semiconductor layers within the semiconductor heterostructure 38 in relation to the profile depicted in FIG. 2. The index of refraction profile of the semiconductor layers with the addition of BN is shown in FIG. 6 by a solid-lined profile, while the index of refraction profile of the layers without BN is represented by the dash-lined profile.

As shown in FIG. 6, the addition of BN will have essentially no effect on the index of refraction of the n-type contact layer 16, however, the addition of BN will have an effect on the index refraction of the other layers in the semiconductor heterostructure 38. In particular, in the active region 18, the addition of BN will result in an effective index of refraction that is less than the effective index of refraction of the active region that does not contain BN, as shown by the region 42A in FIG. 6. This change in the effective index of refraction of the active region 18 arises because the addition of BN to the active region results in the barriers and the quantum wells having a lower index of refraction as shown by regions 42B and 42C, respectively, in comparison to the barriers and quantum wells of the active region that is without BN.

As further shown in FIG. 6, the addition of BN does not have much of an effect on the index of refraction of the p-type layer 20, but it does have a much larger effect on the index of the p-type contact layer 22 like with the active region 18. In particular, FIG. 6 shows that the index of refraction for the p-type layer 20 is slightly lower with the addition of BN as shown in region 44, by the smaller change from the index of refraction that represents the p-type layer 20 without BN. On the other hand, the addition of BN to the p-type contact layer 22 (e.g., p-type superlattice, interlayer) can result in an index of refraction that is significantly less than the index of refraction of the p-type contact layer 22 without BN.

Essentially, FIG. 6 shows that the addition of BN to the semiconductor heterostructure 38 will have a greater impact on the indexes of refraction of the active region 18 and the p-type contact layer 22, and less of an impact on the n-type contact layer 16 and the p-type layer 20. As a result, the changes or differences in the profile of the index of refraction for the active region 18 and the p-type contact layer 22 that occur with the addition of BN will be significant, especially in comparison to the n-type contact layer 16 and the p-type layer 20.

The control and improvement of the indexes of refraction of the semiconductor layers of the semiconductor heterostructure 38 are not limited to the addition of BN, but can include adding other materials and compounds such as boron (B) and/or indium nitride (InN). For example, an interlayer of B can be added to the p-type contact layer 22. In one embodiment, at least one sublayer within the laminate of sublayers (e.g., barriers and quantum wells) of the active region 18 can comprises an interlayer of boron. Similarly, at least one layer of the p-type contact layer 22 that is in the form of a p-type superlattice can include an interlayer of boron, such as the barriers. In one embodiment, the n-type contact layer 16 can comprise a non-zero molar fraction of InN.

The emission of the semiconductor heterostructure 38 can also be improved by nano-patterning one or more of the semiconductor layers that form the heterostructure. As used herein, nano-patterning means adding a regular or irregular pattern to a surface having a roughness scale on the order of 100 nanometers. In general, the nano-patterning can be implemented with the semiconductor heterostructure 38 through the use of a nano-layer such as anodized aluminum nitride (AlN). For example, the active region 18 of the semiconductor heterostructure 38 can be nano-patterned. The p-type layer 20 (e.g., an electron blocking layer) is another layer of the semiconductor heterostructure 38 that can be nano-patterned. It is understood that the other layers of the semiconductor heterostructure 38 such as the n-type contact 16 and the p-contact layer 22 can also be nano-patterned.

Figure 7A:
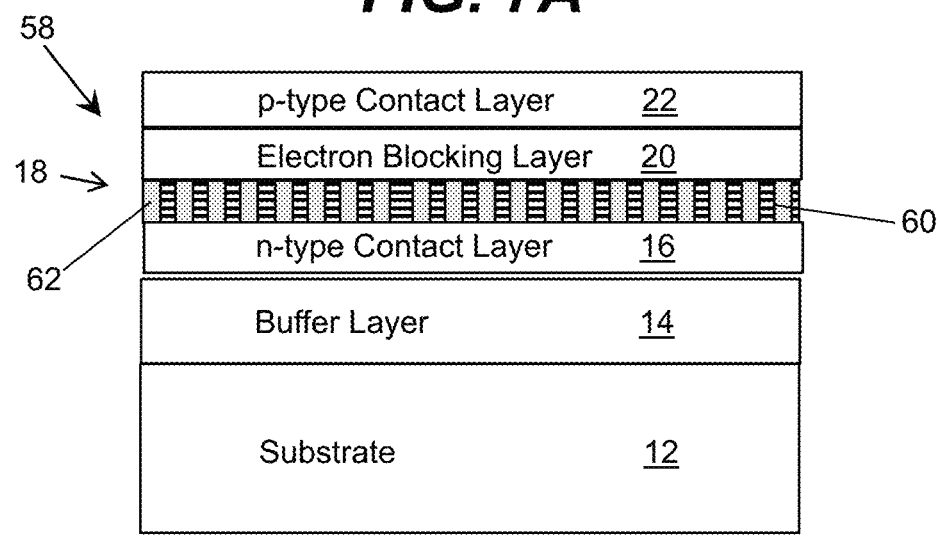
FIGS. 7A and 7B show a cross-sectional view and a top view, respectively, of an illustrative semiconductor heterostructure having nano-patterned domains according to an embodiment.
Figure 7B:
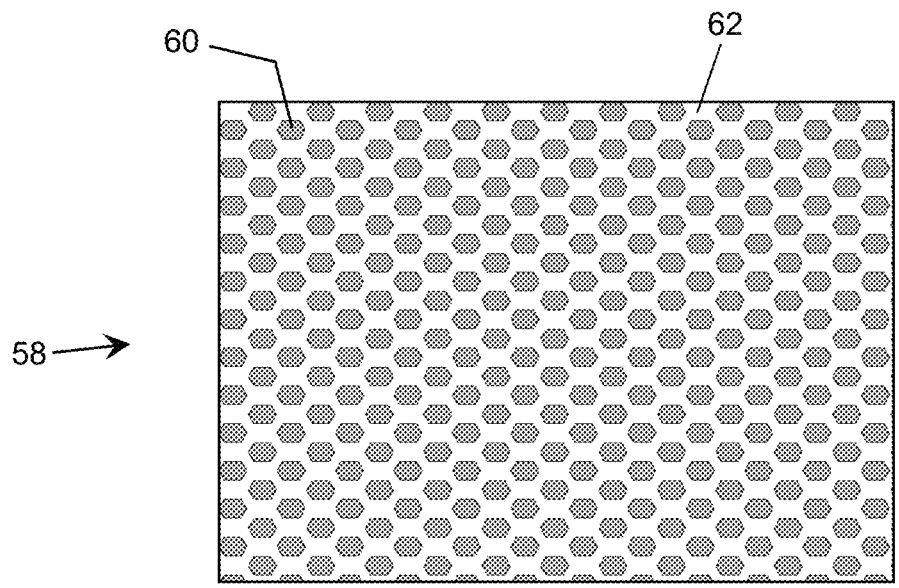

FIGS. 7A and 7B show a cross-sectional view and a top view, respectively, of an illustrative semiconductor heterostructure 58 having nano-patterned domains 60 formed in the active region 18 according to an embodiment. In a scenario in which the active region 18 contains a laminate of sublayers such as for example, barriers and quantum wells, each nano-domain 60 can include stacked semiconductor sublayers (e.g., the barriers and quantum wells). The nano-domains 60 of stacked semiconductor sublayers can form a set of domains in the active region 18.

As shown in FIGS. 7A-7B, the nano-domains 60 can be separated from adjacent nano domains of stacked semiconductor sublayers by a predetermined spacing. In one embodiment, an insulating layer 62, including but not limited to, AAO, $SiO_2$, $Al_2O_3$, $CaF_2$, $MgF_2$, and/or the like, can be formed in the spacings separating adjacent nano domains 60 of stacked semiconductor sublayers. To this extent, the layers of insulating material formed between each of the spacings of the nano domains 60 collectively form a set of nano domains of insulating material within the active region 18. In one embodiment, the set of nano domains of insulating material can have an index of refraction that is less than the index of refraction of the nano-domains 60 of stacked semiconductor sublayers. The index of refraction of the nano domains of insulating material 62 combined with the index of refraction of the nano-domains 60 of stacked semiconductor sublayers to yield an effective index of refraction for the active region 18. It is understood that the effective index of refraction will depend on the average coverage of the insulating layer 62.

In an embodiment, the nano-patterned domains 60 formed in the active region 18 form a photonic crystal, which can have resonance emission at a certain wavelength of radiation. Additionally, a photonic crystal can limit light transport laterally. By limiting lateral transport, absorption outside the active area 18, for example, at the mesa edges not covered with p-ohmic metal, can be limited. Without this structure, the active area 18 can work like a waveguide that spreads light laterally with strong absorption.

The emission of the semiconductor heterostructure 38 can also be improved by utilizing any of a multitude of other modalities. For example, any of the semiconductor layers (e.g., the n-type contact layer 16, the active region 18, the p-type layer 20, and the p-type contact 22) can be formed with a roughness surface at the interface with adjacent layers. Roughness at an interface allows for partial alleviation of the light trapping by providing additional surfaces through which light can escape without totally internally reflecting from the interface. In one embodiment, an interface between the n-type contact layer 16 (i.e., the n-type cladding layer) and the active region 18 can include a roughness surface. In one embodiment, the roughness surface is larger than a wavelength associated with a target radiation that the heterostructure is designed for.

Another example of a modality that can be used to improve the emission of the semiconductor heterostructure 38 includes applying an anti-reflective coating to at least one of the semiconductor layers of the heterostructure. In one embodiment, an anti-reflective coating can be applied at a side of the n-contact layer 16 (e.g., the n-type cladding layer) that is opposite to the interface with the active region 18.

Figure 8:
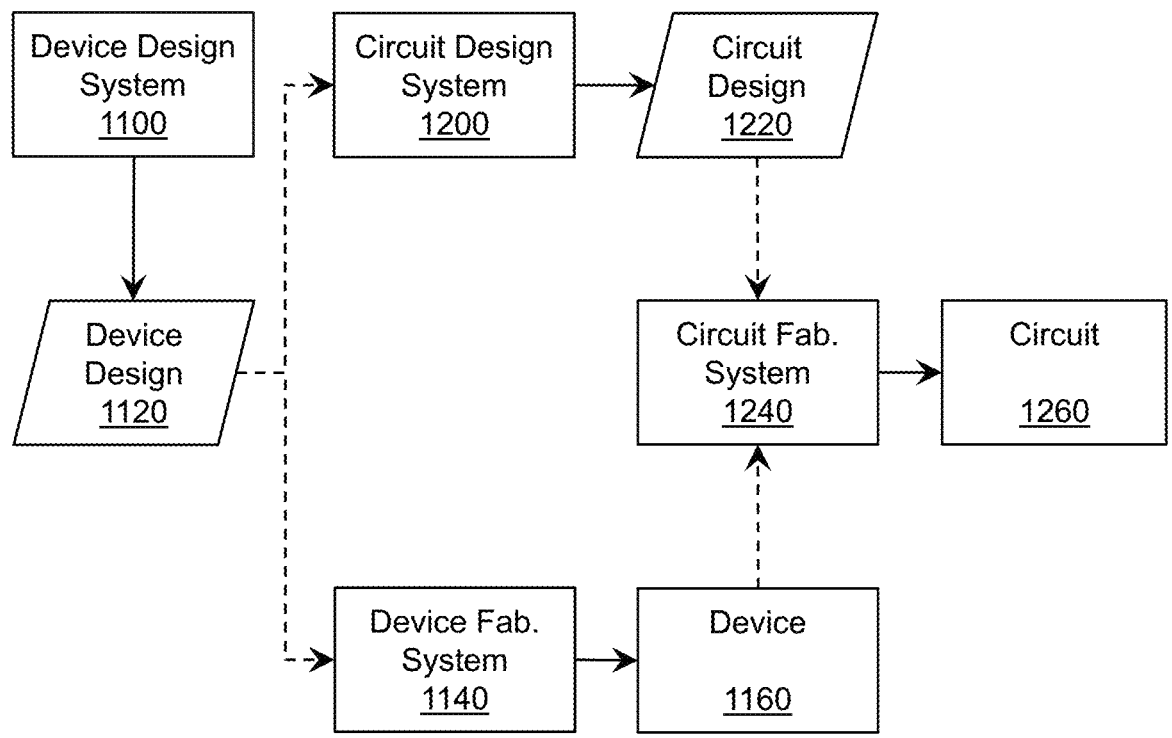
FIG. 8 shows an illustrative flow diagram for fabricating a semiconductor heterostructure according to one of the various embodiments described herein.

In one embodiment, the invention provides a method of designing and/or fabricating a circuit that includes one or more of optoelectronic devices and semiconductor heterostructures having any of the semiconductor structures described herein. To this extent, FIG. 8 shows an illustrative flow diagram for fabricating a circuit 1260 according to an embodiment. Initially, a user can utilize a device design system 1100 to generate a device design 1120 for an optoelectronic semiconductor device as described herein. The device design 1120 can comprise program code, which can be used by a device fabrication system 1140 to generate a set of physical devices 1160 according to the features defined by the device design 1120. Similarly, the device design 1120 can be provided to a circuit design system 1200 (e.g., as an available component for use in circuits), which a user can utilize to generate a circuit design 1220 (e.g., by connecting one or more inputs and outputs to various devices included in a circuit). The circuit design 1220 can comprise program code that includes a device designed as described herein. In any event, the circuit design 1220 and/or one or more physical devices 1160 can be provided to a circuit fabrication system 1240, which can generate a physical circuit 1260 according to the circuit design 1220. The physical circuit 1260 can include one or more devices 1160 designed as described herein.

In another embodiment, the invention provides a device design system 1100 for designing and/or a device fabrication system 1140 for fabricating a semiconductor device 1160 as described herein. In this case, the system 1100, 1140 can comprise a general purpose computing device, which is programmed to implement a method of designing and/or fabricating the semiconductor device 1160 as described herein. Similarly, an embodiment of the invention provides a circuit design system 1200 for designing and/or a circuit fabrication system 1240 for fabricating a circuit 1260 that includes at least one device 1160 designed and/or fabricated as described herein. In this case, the system 1200, 1240 can comprise a general purpose computing device, which is programmed to implement a method of designing and/or fabricating the circuit 1260 including at least one semiconductor device 1160 as described herein. In either case, the corresponding fabrication system 1140, 1240, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1100 to generate the device design 1120 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1100 for designing and/or a device fabrication system 1140 for fabricating an optoelectronic semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor heterostructure, comprising:
   a first semiconductor layer, wherein the first semiconductor layer has a first index of refraction n1;
   a second semiconductor layer located over the first semiconductor layer, the second semiconductor layer comprising an active region including a plurality of quantum wells alternating with a plurality of barriers, wherein the second semiconductor layer has a second index of refraction n2;
   a third semiconductor layer located over the second semiconductor layer, wherein the third semiconductor layer comprises an effective band gap that is wider than an effective bandgap of the first semiconductor layer, wherein the third semiconductor layer has a third index of refraction n3, and wherein n1>n2;

a fourth semiconductor layer located over the third semiconductor layer;

a p-type electrode located over a p-type metal contact, wherein the p-type metal contact is attached to the fourth semiconductor layer;

an n-type electrode located over an n-type metal contact, wherein the n-type metal contact is attached to the first semiconductor layer; and a set of contact pads connected to the p-type electrode and the n-type electrode, wherein a contact pad of the set of contact pads is wider than an electrode of the p-type electrode or the n-type electrode that corresponds to the contact pad.

2. The semiconductor heterostructure of claim 1, wherein the first semiconductor layer and the third semiconductor layer are doped using a same dopant.

3. The semiconductor heterostructure of claim 1, wherein the third semiconductor layer includes a Distributive Bragg Reflector (DBR) structure comprising an Si-doped p-type composition.

4. The semiconductor heterostructure of claim 1, wherein-the the fourth semiconductor layer has a fourth index of refraction n4, wherein n1>n2>n3>n4.

5. The semiconductor heterostructure of claim 1, wherein an average band gap of the fourth semiconductor layer is greater than an energy separation of energy levels within the plurality of quantum wells and the plurality of barriers in the second semiconductor layer.

6. The semiconductor heterostructure of claim 1, wherein the second semiconductor layer has an average absorption to a target radiation that is similar to an average absorption of the first semiconductor layer and the third semiconductor layer.

7. The semiconductor heterostructure of claim 1, wherein the fourth semiconductor layer comprises a p-type superlattice including a plurality of quantum wells alternating with a plurality of barriers.

8. The semiconductor heterostructure of claim 7, wherein a band gap of the third semiconductor layer and a band gap of the plurality of barriers within the p-type superlattice are wider than a band gap of the plurality of quantum wells in the active region.

9. A semiconductor heterostructure, comprising:
an n-type layer, wherein the n-type layer has a first index of refraction n1;
an active region located over the n-type layer, the active region including a plurality of quantum wells alternating with a plurality of barriers, wherein the active layer has a second index of refraction n2;
a first p-type layer located over the active layer, wherein the first p-type layer comprises an effective band gap that is wider than an effective bandgap of the n-type layer, wherein the first p-type layer has a third index of refraction n3, and wherein n1>n2;
a second p-type layer located over the first p-type layer;
a p-type electrode located over a p-type metal contact, wherein the p-type metal contact is attached to the second p-type layer;
an n-type electrode formed over an n-type metal contact, wherein the n-type metal contact is attached to the n-type layer; and
a set of contact pads connected to the p-type electrode and the n-type electrode, wherein a contact pad of the set of contact pads is wider than an electrode of the p-type electrode or the n-type electrode that corresponds to the contact pad.

10. The semiconductor heterostructure of claim 9, wherein the n-type layer and the first p-type layer are doped using a same dopant.

11. The semiconductor heterostructure of claim 9, wherein the first p-type layer includes a Distributive Bragg Reflector (DBR) structure comprising an Si-doped p-type composition.

12. The semiconductor heterostructure of claim 9, wherein the n the second p-type layer has a fourth index of refraction n4, wherein n1>n2>n3>n4.

13. The semiconductor heterostructure of claim 9, wherein an average band gap of the second p-type layer is greater than an energy separation of energy levels within the plurality of quantum wells and the plurality of barriers in the active layer.

14. The semiconductor heterostructure of claim 9, wherein the second p-type layer comprises a p-type superlattice including a plurality of quantum wells alternating with a plurality of barriers, and wherein a band gap of the first p-type layer and a band gap of the plurality of barriers within the p-type superlattice are wider than a band gap of the plurality of quantum wells in the active region.

15. An optoelectronic device, comprising:
a semiconductor heterostructure, including:
a sapphire substrate;
a buffer layer comprising AlGaN located over the sapphire substrate;
an n-type cladding layer located over the buffer layer, wherein the n-type cladding layer has a first index of refraction n1;
an active region located over the n-type cladding layer, the active region including a plurality of quantum wells alternating with a plurality of barriers, wherein the active region has a second index of refraction n2;
a Distributive Bragg Reflector (DBR) structure located over the active region, wherein the DBR structure comprises a doped p-type composition, wherein the DBR structure has a third index of refraction n3, and wherein n1>n2;
a p-type layer located over the DBR structure;
a p-type electrode located over a p-type metal contact, wherein the p-type metal contact is attached to the p-type layer;
an n-type electrode located over an n-type metal contact, wherein the n-type metal contact is attached to the n-type cladding layer; and
wherein a contact pad of the set of contact pads is wider than an electrode of the p-type electrode or the n-type electrode that corresponds to the contact pad.

16. The optoelectronic device of claim 15, wherein the n-type cladding layer is doped using a dopant.

17. The optoelectronic device of claim 15, wherein the DBR structure comprises a Si-doped p-type composition.

18. The optoelectronic device of claim 15, wherein an average band gap of the p-type layer is greater than an energy separation of energy levels within the plurality of quantum wells and the plurality of barriers in the active layer.

19. The optoelectronic device of claim 15, wherein the active region has an average absorption to a target radiation that is similar to an average absorption of the n-type cladding layer.

20. The optoelectronic device of claim 15, wherein the p-type layer comprises a p-type superlattice including a plurality of quantum wells alternating with a plurality of barriers.

* * * * *